United States Patent [19]

Kasper et al.

[11] Patent Number: 4,609,104
[45] Date of Patent: Sep. 2, 1986

[54] RFI SHIELDED, MULTIPLE PART CONTAINER AND COMPONENTS THEREOF

[75] Inventors: Kevin Kasper, Elm Grove, Wis.; Paul Nigro, Norridge, Ill.

[73] Assignee: ADE, Inc., Chicago, Ill.

[21] Appl. No.: 741,180

[22] Filed: Jun. 4, 1985

[51] Int. Cl.4 .............................................. B65D 81/14
[52] U.S. Cl. ..................................... 206/334; 206/328
[58] Field of Search ............... 206/328, 334, 592, 444, 206/312

[56] References Cited

U.S. PATENT DOCUMENTS

| | | |
|---|---|---|
| 4,160,503 | 7/1979 | Ohlbach . |
| 4,241,829 | 12/1980 | Hardy .................................. 206/328 |
| 4,293,070 | 10/1981 | Ohlbach ............................. 206/328 |
| 4,308,953 | 1/1982 | Cohen . |
| 4,424,900 | 1/1984 | Petcavich .......................... 206/328 |
| 4,471,872 | 9/1984 | Dedon ................................ 206/328 |
| 4,480,747 | 11/1984 | Kazor et al. . |

OTHER PUBLICATIONS

Brochure of ADE, Inc., Copyright 1983 Entitled "Caddy-Pack Transporters".

Primary Examiner—Joseph Man-Fu Moy
Attorney, Agent, or Firm—Willian, Brinks, Olds, Hofer, Gilson & Lione Ltd.

[57] ABSTRACT

A two part EMI/RFI shielded container for electrical components includes a transporter which has a metal layer on its inner surface. The transporter is generally tubular in shape when closed, and at least one foldable tab is formed on the transporter to expose the metal layer to the outside when the tab is bent back. The container also includes a sleeve sized to receive the transporter. The sleeve defines a metal layer on its inner surface, which is brought into electrical contact with the tab of the transporter when the transporter is slid into the sleeve. Two ends of a blank are joined together to form the sleeve, and one of these ends is folded back on itself in order to place the metal layer of the sleeve into low resistance electrical contact across the joint.

18 Claims, 13 Drawing Figures

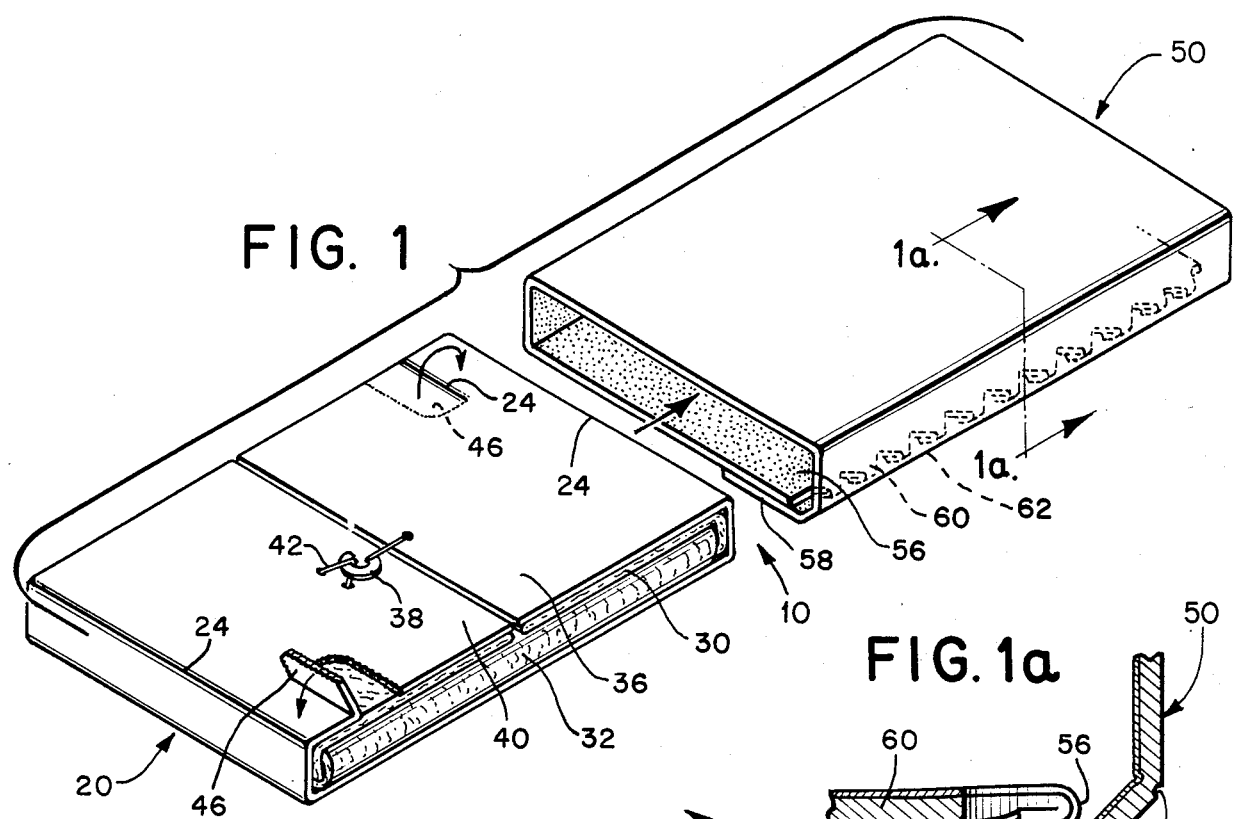
FIG. 1
FIG. 1a
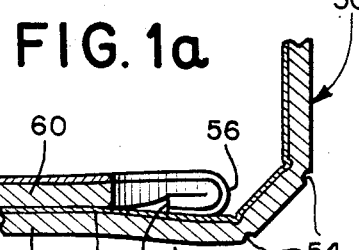
FIG. 2a
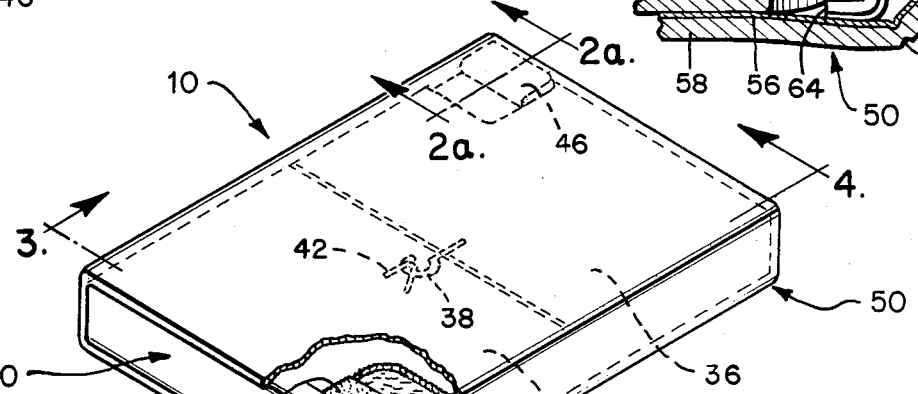
FIG. 2
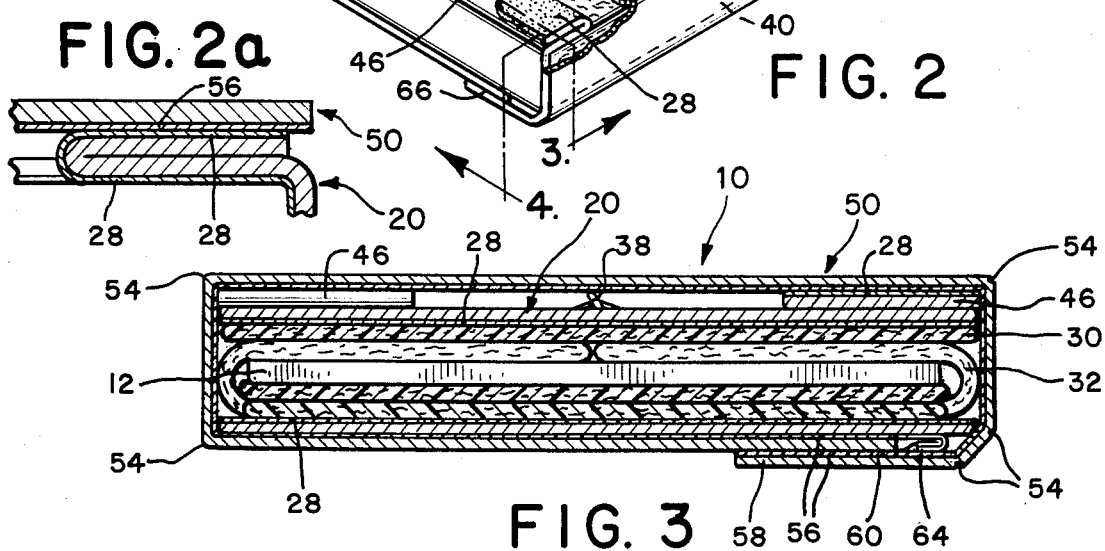
FIG. 3

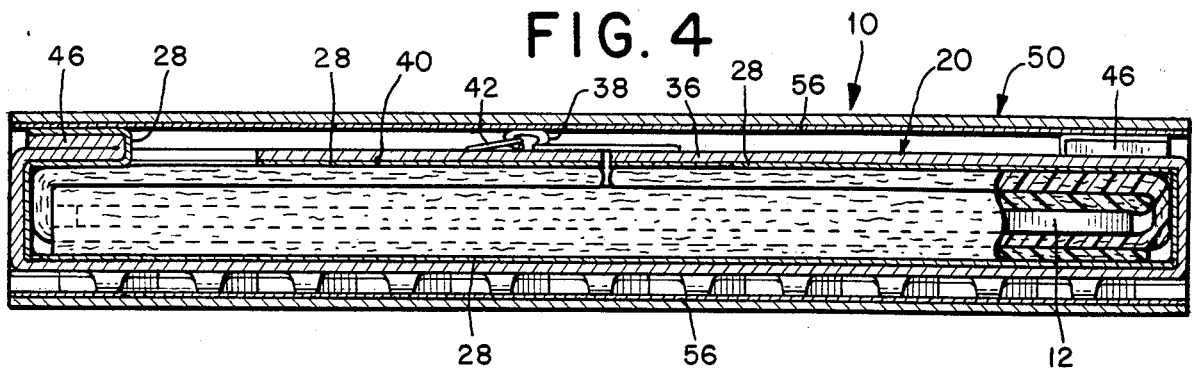
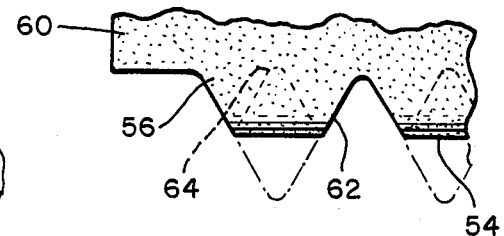
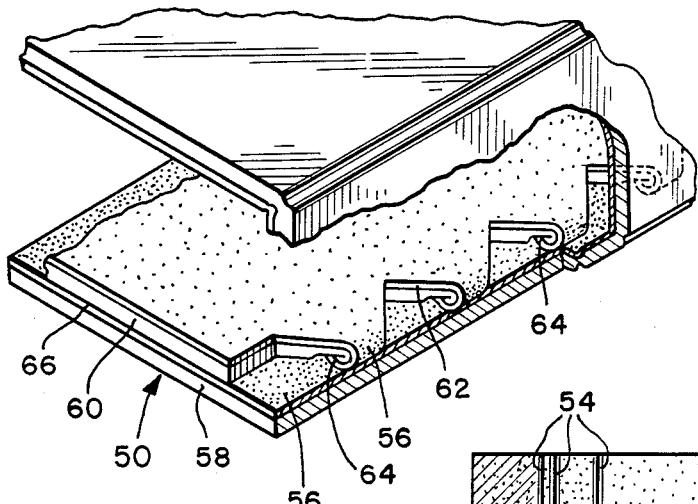
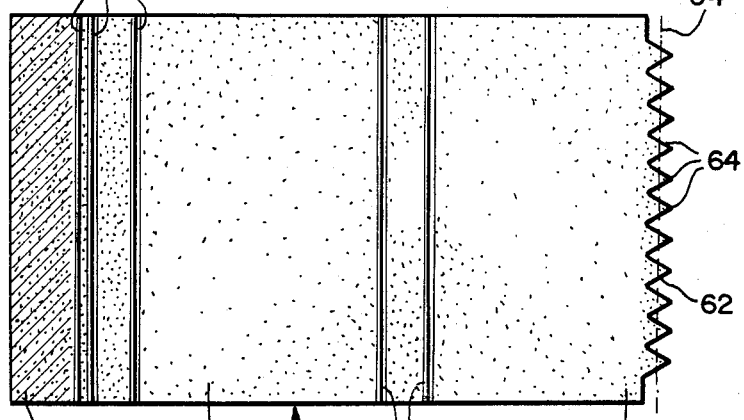

RFI SHIELDED, MULTIPLE PART CONTAINER AND COMPONENTS THEREOF

BACKGROUND OF THE INVENTION

The present invention relates to an improved EMI/RFI shielded, two part container for components such as circuit boards and the like.

Modern miniaturized electronic components are sensitive to damage from physical shock, vibration, and external electric fields such as static electric fields and EMI/RFI fields. Either physical shock or such electric fields, if not controlled, can decrease the effective life or even destroy the function of the component.

Such potentially damaging external electric fields can be generated at many stages in the development, production, and shipment of electronic components such as circuit boards. Static electric fields can be generated whenever two objects come in contact with one another and are then separated. EMI/RFI fields can be generated by static discharges or by transmitters of various types.

A number of approaches have been used in the past to protect electronic components from external electric fields. EMI/RFI bags and pouches have been used, in which the bag or pouch is sealed around the electronic component, and then placed in a cushioned box for required physical protection. Closure of the EMI/RFI bag can present difficulties, and EMI/RFI protection varies in accordance with the effectiveness of the seal. Each time an EMI/RFI bag is opened, it must be replaced or resealed in order to maintain EMI/RFI protection.

Another approach of the prior art is to use permanent metal containers or metal lined containers. Such containers may provide effective sealing and EMI/RFI protection. However, the cost of such containers may be prohibitive for many applications.

Another approach is to provide shielded shipping containers. U.S. Pat. Nos. 4,160,503, 4,308,953, and 4,480,747 provide three examples of such containers. These containers may work well depending upon the specific design of the container and its conductive surfaces. Nevertheless, a need exists for an improved multiple part container which combines excellent physical protection to the electronic component along with excellent DC and static field and EMI/RFI shielding.

SUMMARY OF THE INVENTION

The present invention is directed to an improved EMI/RFI shielded, multiple part container which is versatile and economical in use and provides excellent physical and EMI/RFI protection to components held by the container.

According to this invention, a multiple part protective container is provided which comprises a sleeve comprising a first sheet of material having a first continuous layer of a conductive metal on one side thereof. This sheet defines two ends which are bonded together at a joint to form the sheet into a sleeve, with the metal layer extending over the inner surface of the sleeve. One of the two ends of the sheet is folded over at a fold line to bring the metal layer at the two ends into electrical control across the joint.

A transporter is provided which is sized to slide within the sleeve. This transporter includes a second continuous layer of a conductive metal which extends over an inner surface of the transporter. The transporter defines at least one tab foldable outwardly to bring the second metallic layer of the transporter into low resistance sliding electrical contact with the metallic layer of the sleeve as the transporter is slid into the sleeve. The sleeve and transporter cooperate to provide effective EMI/RFI shielding to objects within the transporter when the transporter is received within the sleeve. This invention is also directed to the sleeve of this invention and the transporter of this invention standing alone as separate components.

The container of this invention provides important advantages in use. The two part design provides excellent versatility, in that the transporter can be used alone for in-house storage, and the transporter can be combined with the sleeve for shipping purposes. If the sleeve is damaged it can readily be replaced, without replacing the more expensive transporter. This container is not labor intensive or cumbersome to use, and it can be quite economical in terms of cost per use because the components are reusable.

In the embodiment described below, the assembled container does not exhibit exposed metal surfaces, and thus it offers no ready points of discharge. Furthermore, since the shielding metal layers are not exposed in the assembled container, ordinary scuffing such as is commonly encountered during shipment does not damage the metal shielding layer and does not impair EMI/RFI shielding.

The invention itself, together with further objects and attendant advantages, will best be understood by reference to the following detailed description, taken in conjunction with the accompanying drawings.

BRIEF DESCRIPTION OF THE DRAWINGS

FIG. 1 is a perspective view of a presently preferred embodiment of the multiple part protective container of this invention.

FIG. 1a is a partial sectional view taken along line 1a—1a of FIG. 1.

FIG. 2 is a perspective view of the embodiment of FIG. 1, in which the transporter is shown positioned within the sleeve.

FIG. 2a is a partial sectional view taken along line 2a—2a of FIG. 2.

FIG. 3 is a sectional view taken along line 3—3 of FIG. 2.

FIG. 4 is a sectional view taken along line 4—4 of FIG. 2.

FIG. 5 is a partial perspective view in partial cutaway of a portion of the sleeve of FIG. 1.

FIG. 5a is a partial plan view of a portion of the sleeve of FIG. 1.

FIG. 6 is a plan view of a die-cut blank from which the sleeve of FIG. 1 is formed.

FIG. 7 is a plan view of a die-cut blank from which the transporter of FIG. 1 is formed.

DETAILED DESCRIPTION OF THE PRESENTLY PREFERRED EMBODIMENTS

Figure 8:
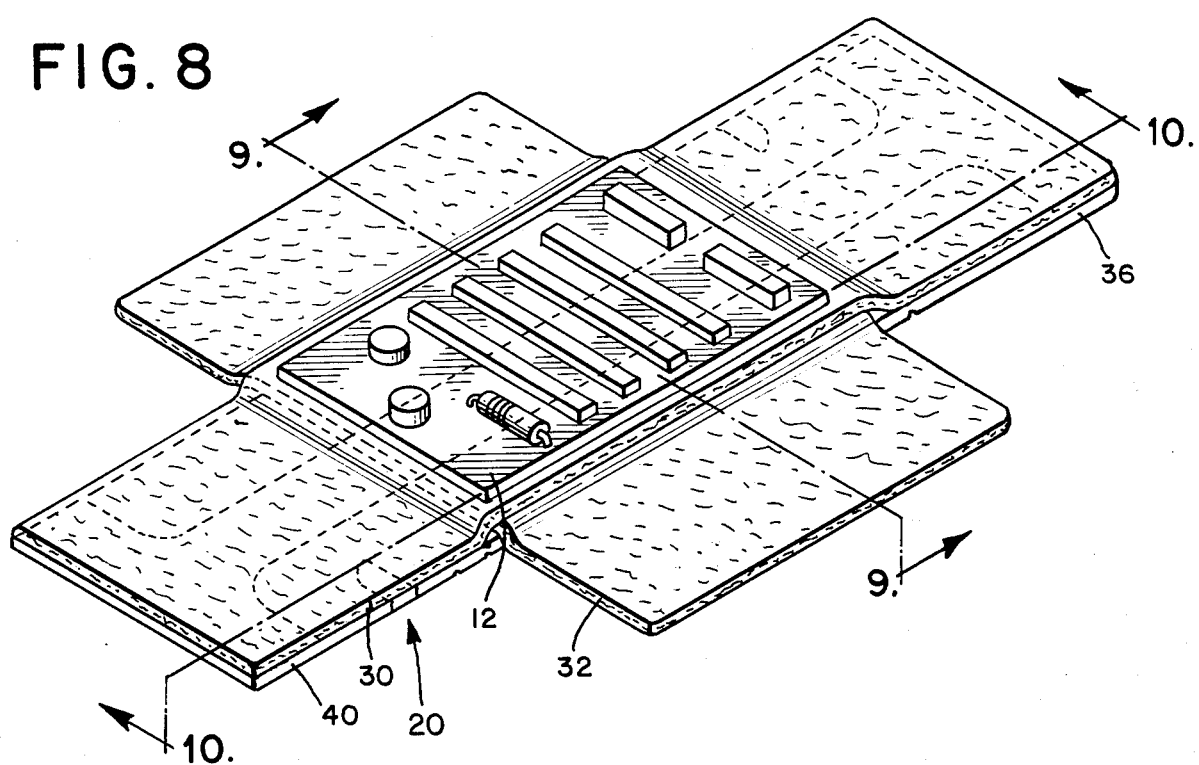
FIG. 8 is a perspective view of the transporter of FIG. 1 in its opened state.

Turning now to the drawings, FIGS. 1 and 2 show perspective views of a two part container 10 which represents a presently preferred embodiment of this invention. This container 10 includes a transporter 20 and a sleeve 50. The transporter 20 and the sleeve 50 are two separate components which are slidable with respect to one another, and they will be described separately in the following discussion.

The transporter 20 is formed from a blank 22 as shown in FIG. 7. This blank 22 is die cut and includes a number of embossed fold lines 24 as well as two die cut lines 26. The die cut blank 22 is preferably formed of a sheet of a corrugated paperboard to which a metal foil layer 28 is bonded. The die cut lines 26 serve to define two foldable tabs 46 which can be bent outwardly as described below.

Two sheets 30,32 of a suitable shock absorbing material are adhesively affixed to the metal foil 28 (FIG. 8). The transverse sheet 32 is first adhesively bonded to the central portion of the metal foil 28, and then the longitudinal sheet 30 is adhesively bonded to the metal foil 28 on either side of the transverse sheet 32. In FIG. 7, reference number 44 is used to denote the I-shaped pattern of glue used to hold the sheets 30,32 of shock absorbing material to the metal foil 28.

In this embodiment, the shock absorbing material 30 is a reinforced cellular cushioning material which defines an array of vented cells. The shock absorbing material 30,32 is formed of a suitable plastic which does not generate static electric charge, which does not lose its cushioning effectiveness if punctured, and which readily conforms to the surface of delicate electronic components without damage to the components. In this embodiment each of the cells is vented to atmosphere and provided with walls of tapered cross-section. The sheets 30,32 of shock absorbing material provide physical protection to a component 12 held within the transporter 20 against shock and vibration.

As shown in FIGS. 1 and 7, the blank 22 defines a first end 36 to which is mounted a hook 38, and a second end 40 to which is mounted a loop 42. The loop 42 in this embodiment is formed of an elastic material, and the hook 38 can be engaged with the loop 42 to hold the transporter 20 in the closed position shown in FIG. 1.

As best shown in FIG. 6, the sleeve 50 is formed from a die cut blank 52. The die cut blank 52 is preferably formed of a corrugated paperboard to which a thin metal foil 56 has been bonded to one side. During the die cutting operation a number of fold lines 54 are embossed in the blank 52. The blank 52 defines first and second ends 58,60. The second end 60 defines an undulating pattern 62 which in this embodiment is a saw-tooth pattern. The saw-tooth pattern 62 defines an array of tips 64, and one of the fold lines 54 extends across these tips 64 to define a preferred fold line. The sleeve 50 is formed from the blank 52 by gluing the first and second ends 58,60 together at a joint 66. As best shown in FIGS. 1a, 5 and 5a, the tips 64 of the saw-tooth pattern 62 are folded along the respective fold line 54 in order to bring the metal layer 56 of the tips 64 into intimate, low electrical resistance contact with the metal layer 56 at the first end 58.

Figure 9:
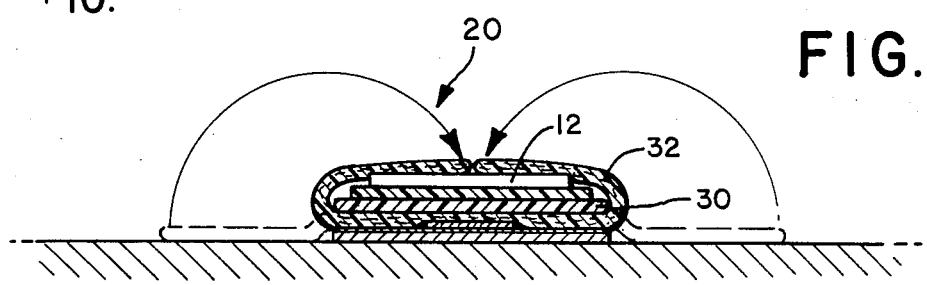
FIG. 9 is a cross-sectional view taken along line 9—9 of FIG. 8.
Figure 10:
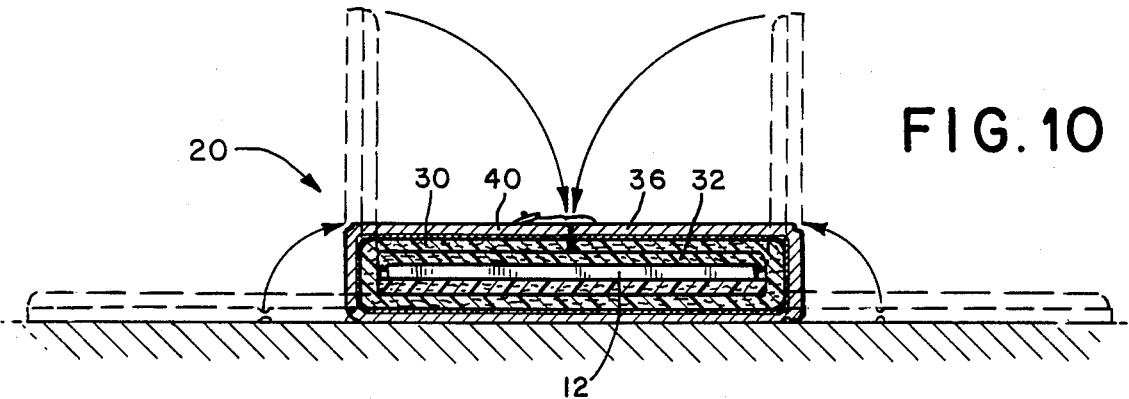
FIG. 10 is a cross-sectional view taken along line 10—10 of FIG. 8.

As best shown in FIG. 8, the container 10 is used by first placing an electrical component 12 such as a circuit board on the unfolded sheets 30,32 of shock absorbing material. The transverse sheet 32 is then folded in to enclose the component 12 on the sides (FIG. 9), and the ends 36,40 are then folded in and held in confronting relationship by the hook 38 and the loop 42 as shown in FIG. 10. The tabs 46 are then folded back to expose the metal layer 28 (FIG. 1), and the transporter 20 is pushed into the sleeve 50 (FIGS. 2-4). Once the transporter 20 is fully in place within the sleeve 50, both of the tabs 46 provide low resistance electrical contact between the metal layer 28 of the transporter 20 and the metal layer 56 of the sleeve 50 (FIGS. 2a and 3). Once fully assembled, the container 10 provides excellent protection to the component 12 against shock and vibration, against DC fields, and against EMI/RFI damage.

The following information is provided merely by way of example in order to more completely define the presently preferred embodiment of this invention. It should be clearly understood that these details of construction are in no way meant to limit the scope of this invention.

In this embodiment, the blank 22 is formed of three sheets of paper: the first sheet is 42-pound Kraft paper to which an aluminum foil 0.003 inch in thickness has been laminated; the second sheet is the fluted medium in which in this embodiment is 26-pound semi-chem Kraft paper; the third sheet is the top sheet which is in this embodiment is 42-pound Kraft paper as well. A suitable material for use as the first sheet may be obtained from Smurfit Laminations of Elk Grove Village, Ill. The material from which the blank 22 is formed is glued together on a conventional corrugating machine with cornstarch glue. The first sheet with the metal layer 28 is placed on the single backer roll with the metal layer 28 on the outside. In this way, the outside of the transporter 20 is provided with a smooth surface which can readily be printed. The finished material from which the blank 22 is cut has a weight of 200 pounds per 1000 square feet. The heating area of the corrugating machine in the drying section is preferably waxed with a bar wax such as parafin to reduce snagging of the metal layer 28.

The blank 52 of the sleeve 50 is cut in a conventional die cut machine. The joint 60 is then formed in a conventional folder-taper-gluer machine which automatically bends the tips 64 over prior to gluing. In alternate embodiments it may well be preferable to bend the entire second end 60 over in order to provide complete edge-to-edge contact across the joint 66. However, the preferred embodiment described above provides the important advantage that the joint 66 can be formed on a conventional folder-taper-gluer machine without modification to the machine, and without subsequent separation of the joint 66. It has been found with at least one conventional folder-taper-gluer machine that folding back of the entire edge results in excessive pressures for commercial operation. However, it may well be desirable to modify a folder machine in other applications. A suitable adhesive for the joint 66 is a resin adhesive such as that marketed as Ajax AC 292.

Of course, it should be understood that other applications can use other undulating patterns than the saw-tooth pattern shown in the drawings. For example, sine wave patterns or other smoothly varying curves can be used.

For quality control purposes, following fabrication of the sleeve 50 the effectiveness of the joint 66 can be measured by cutting open the sleeve 50 at a point distant from the joint 66 and then measuring the electrical resistance across the joint 66. This electrical resistance should be comparable to the electrical resistance across two points on an uninterrupted portion of the metal layer 28.

In this embodiment, the blank 22 is formed of the same material as the blank 52. The preferred shock absorbing material for the sheets 30,32 is that manufactured by the assignee of the present invention under the trade name CANCEL. This shock absorbing material is of the general type described in U.S. Pat. No. 3,769,145 and No. 3,837,991. This material, per se, does not form part of this invention and will not therefore be described here in greater detail. However, this material does provide important advantages in that it delivers a high level of shock protection using less material than other commercial alternatives. With less shock absorbing material the size of the transporter is minimized, which reduces the size of openings or gaps between the transporter and the sleeve, thereby improving the EMI/RFI shielding. In addition, this material provides excellent shock and vibration protection and possesses a long life. It is well-suited for reuse in that puncture of the cellular material will not impair its cushioning performance. The resistivity of the material from which the shock absorbing material is formed is preferably $10^{10}$ ohms per square. This resistivity is effective in preventing the material from generating a static charge itself.

The glue pattern described above for holding the sheets 30,32 of shock absorbing material to the metal layer 28 provides advantages in that it keeps glue off of the tabs 46, and it allows the portions of the transverse sheet 32 near the edge of the blank 22 to lift as necessary to surround the component 12 snugly. In this embodiment, the glue used to hold the shock absorbing material in place is a cold latex glue applied with rollers. A suitable glue can be obtained from Fuller Adhesives as adhesive 3885-J.

The preferred embodiment described above provides important advantages in operation. First, it provides excellent physical protection as well as excellent shielding against DC fields and EMI/RFI damage. It is simple to use, it is not labor intensive in any way, and it is excellently suited for reuse. Though ordinary scuffing does not damage the metal layer on either the sleeve 50 or the transporter 20, in use the sleeve 50 may become damaged. If so, the sleeve 50 can be replaced inexpensively while retaining the transporter 20. Because the parts are independently reusable the container 10 is economical in use. It should also be noted that once assembled there are no exposed metal surfaces on the container 10, and thus the container 10 does not provide a ready point for discharge or charge.

The static-free hook 38 and static-free loop 42 hold the transporter 20 closed even when not in place in the sleeve 50, and the transporter 20 can be used alone for in-house transportation and storing of the component 12. Furthermore, the hook 38 and loop 42 prevent the transporter 20 from opening if it is inverted, as for example during removal from the sleeve 50. When the transporter 20 is used in connection with the component 12, the transporter 20 can provide an effectively grounded work station. That is, the transporter 20 can be partially removed from the sleeve 50 and a ground strap can be clamped to one of the tabs 46. Once the transporter 20 is properly grounded, it can be completely removed from the sleeve 50 and then unfolded. When unfolded the metal layer 28 is entirely covered by the shock absorbing material of the longitudinal sheet 30 and the metal layer 28 acts as a grounded plane.

It is also important that in the preferred embodiment the metal layers 28,56 provide continuous conductive layers of solid metal without cracks at bend lines. In this way, openings and gaps in the EMI/RFI shielding are minimized.

Of course, it should be understood that a wide range of changes and modifications can be made to the preferred embodiment described above. For example, the shape of the first and second ends of the sleeve can be modified as desired, and a variety of conductive metal layers can be substituted for the foils 28,56. In addition, a wide variety of shock absorbing materials 30,32 may be used, and in some applications it may not even be necessary to include a shock absorbing material. The number and shape of the tabs can also be modified as desired. Of course, specific sizes, proportions, shapes, and materials can be modified as desired. Furthermore, the transporter of this invention can be used with other types of shipping sleeves or even without shipping sleeves in some applications, and the shipping sleeve of this invention can be used with other types of transporters.

It is therefore intended that the foregoing detailed description be regarded as illustrative rather than limiting, and that it be understood that it is the following claims, including all equivalents, which are intended to define the scope of this invention.

We claim:

1. A multiple part protective container comprising:
   a sleeve comprising a first sheet of material having a first continuous conductive layer on one side thereof, said first sheet defining two ends bonded together at a joint to form the first sheet into the sleeve, said first conductive layer extending over an inner surface of the sleeve, at least a part of one of the two ends being folded over at a fold line to bring the first conductive layer of the two ends into low resistance contact across the joint; and
   a transporter sized to slide within the sleeve, said transporter comprising a second continuous conductive layer extending over an inner surface of the transporter, said transporter defining at least one tab foldable outwardly to bring the second conductive layer into low resistance, sliding electrical contact with the first conductive layer as the transporter is slid into the sleeve;
   said sleeve and transporter cooperating to provide effective EMI/RFI shielding to objects within the transporter when the transporter is received within the sleeve.

2. The invention of claim 1, wherein the first and second conductive layers comprise respective metal foils.

3. The invention of claim 1, wherein both the sleeve and the transporter comprise corrugated paperboard.

4. The invention of claim 1, wherein an edge of the folded over one of the two ends is shaped in an undulating pattern extending back and forth across the fold line to reduce the length of the first sheet folded along the fold line.

5. The invention of claim 4, wherein the undulating pattern comprises a saw-tooth pattern.

6. The invention of claim 1, wherein the transporter comprises a shock absorbing material secured to the second conductive layer.

7. The invention of claim 6, wherein the shock absorbing material comprises two layers of cellular cushioning material secured to the second conductive layer in a cruciform pattern.

8. A multiple part protective container comprising:

a sleeve comprising a first corrugated paperboard sheet having a first metal foil bonded to one side of the first sheet, said first sheet defining two ends bonded together at a joint to form the first sheet into the sleeve, said first metal foil extending over an inner surface of the sleeve, a first one of the two ends shaped in a saw-tooth pattern which extends back and forth across a fold line, said first end folded at the fold line to bring the first metal foil at the first end into physical and low resistance electrical contact with the first metal foil at the other end across the joint;

a transporter sized to slide within the sleeve, said transporter comprising a second corrugated paperboard sheet having a second metal foil bonded to one side of the second sheet, said second sheet defining two ends and folded to a tubular shape with the two ends in confronting relationship and the second metal foil located on an inner surface of the transporter, said transporter defining two tabs, each near a respective one of the ends of the second sheet, and each foldable outwardly to bring the second metal foil into low resistance, sliding electrical contact with the first metal foil as the transporter is slid into the sleeve; and at least one layer of a shock absorbing material secured to the second metal foil;

said sleeve and transporter cooperating to provide effective EMI/RFI shielding to objects within the transporter when the transporter is received in the sleeve.

9. The invention of claim 8, wherein the shock absorbing material comprises two layers of a cellular cushioning material secured to the second metallic layer in a cruciform pattern.

10. A shipping sleeve for use with a transporter to provide EMI/RFI shielding to objects within the transporter, said shipping sleeve comprising:

a sheet of material having a continuous conductive layer on one side thereof, said sheet defining first and second ends bonded together at a joint to form the sheet into a sleeve with the conductive layer extending over an inner surface of the sleeve;

at least a part of one of the two ends being folded over at a fold line to bring the conductive layer at the two ends into low resistance electrical contact across the joint.

11. The invention of claim 10, wherein the conductive layer comprises a metal foil.

12. The invention of claim 10, wherein the sheet comprises corrugated paperboard.

13. The invention of claim 10, wherein an edge of the folded over one of the two ends is shaped in an undulating pattern extending back and forth across the fold line to reduce the length of the first sheet folded along the fold line.

14. The invention of claim 13, wherein the undulating pattern comprises a saw-tooth pattern.

15. A transporter for use with an external conductor to shield an object contained in the transporter from EMI/RFI, said transporter comprising:

a sheet of material having a continuous conductive layer on one side thereof, said sheet defining two opposed ends, said sheet folded to a tubular shape with the two opposed ends aligned in confronting relationship and the conductive layer extending over an inner surface of the tubular shape;

at least one tab defined by the sheet and foldable outwardly to expose a portion of the conductive layer secured to the tab to the exterior of the tubular shape in order to provide electrical interconnection between the conductive layer and the external conductor situated outside of and alongside said outwardly folded tab.

16. The invention of claim 15, wherein the transporter comprises a shock absorbing material secured to the conductive layer.

17. The invention of claim 16, wherein the shock absorbing material comprises two layers of a cellular cushioning material secured to the conductive layer in a cruciform pattern.

18. The invention of claim 15 wherein the conductive layer comprises a metal foil.

* * * * *

UNITED STATES PATENT AND TRADEMARK OFFICE
CERTIFICATE OF CORRECTION

PATENT NO. : 4,609,104

DATED : Sept. 2, 1986

INVENTOR(S) : Kevin Kasper et al.

It is certified that error appears in the above-identified patent and that said Letters Patent is hereby corrected as shown below:

In column 1, line 64, please delete "control" and substitute therefor --contact--.

Signed and Sealed this

Nineteenth Day of April, 1988

*Attest:*

DONALD J. QUIGG

*Attesting Officer*  *Commissioner of Patents and Trademarks*